United States Patent [19]

Hirai et al.

[11] Patent Number: 5,164,277
[45] Date of Patent: Nov. 17, 1992

[54] LIGHT-SENSITIVE MATERIAL CONTAINING SILVER HALIDE, REDUCING AGENT AND POLYMERIZABLE COMPOUND

[75] Inventors: Hiroyuki Hirai; Makoto Yamada, both of Kanagawa, Japan

[73] Assignee: Fuji Photo Film Co., Ltd., Kanagawa, Japan

[21] Appl. No.: 871,750

[22] Filed: Apr. 21, 1992

[30] Foreign Application Priority Data

Apr. 22, 1991 [JP] Japan .................. 3-116667

[51] Int. Cl.$^5$ .............................. G03C 1/77
[52] U.S. Cl. ...................... 430/138; 430/281; 430/288; 430/204; 430/292; 430/495
[58] Field of Search ............. 430/158, 281, 288, 204, 430/495, 567, 297

[56] References Cited

U.S. PATENT DOCUMENTS

| | | | |
|---|---|---|---|
| 4,956,260 | 9/1990 | Nakamura | 430/138 |
| 4,963,460 | 10/1990 | Oka | 430/138 |
| 4,970,132 | 11/1990 | Nakamura | 430/138 |
| 4,971,884 | 11/1990 | Yamamoto | 430/138 |

Primary Examiner—Jack P. Brammer
Attorney, Agent, or Firm—Sughrue, Mion, Zinn, Macpeak & Seas

[57] ABSTRACT

A light-sensitive material comprises a support and a light-sensitive layer provided thereon. The light-sensitive layer contains silver halide, a reducing agent and a polymerizable compound. In the light-sensitive material of the present invention, the polymerizable compound is a (meth)acrylic ester of an adduct of ditrimethylolpropane with an alkylene oxide. The amount of the alkylene oxide in the adduct is 1 to 10 mole based on one mole of ditrimethylolpropane.

10 Claims, No Drawings

LIGHT-SENSITIVE MATERIAL CONTAINING SILVER HALIDE, REDUCING AGENT AND POLYMERIZABLE COMPOUND

FIELD OF THE INVENTION

The present invention relates to a light-sensitive material which comprises a support and a light-sensitive layer provided thereon containing silver halide, a reducing agent and a polymerizable compound.

BACKGROUND OF THE INVENTION

A light-sensitive material comprises a support and a light-sensitive layer provided thereon containing silver halide, a reducing agent and a polymerizable compound. An image is formed by imagewise exposing the light-sensitive material, and heating the light-sensitive material. A latent image of the silver halide is formed by the exposure. The polymerizable compound is polymerized within the area where the latent image has been formed by the heat development process. After the heat development process, the light-sensitive material is usually pressed on an image receiving material to transfer the unpolymerized polymerizable compound to the image receiving material. This image forming method is disclosed in U.S. Pat. No. 4,629,676 (European Patent Publication No. 0174634A2 and Japanese Patent Provisional Publications No. 61(1986)-69062 and No. 61(1986)-73145).

Another embodiment of the image forming methods is disclosed in Japanese Patent Provisional Publications No. 61(1986)-260241, No. 2(1990)-141756, No. 2(1990)-141757, No. 2(1990)-207254 and No. 2(1990)-262662. The contents of the former two publications are described in European Patent Provisional Publication No. 0202490A. In this embodiment, a polymerization inhibitor is formed from an oxidation product of a reducing agent within the area where the latent image of the silver halide has been formed.

In the above-mentioned image forming method, it is difficult to obtain a clear transferred image having a high maximum density without causing stain. The stain can be reduced when the temperature of the heat development process is low. However, the maximum density is remarkably reduced by the high temperature. Therefore, it is also difficult to form a clear image if the heat development conditions are changed.

By the way, the polymerizable compound used in the light-sensitive material preferably is an acrylate or methacrylate.

Examples of the acrylate disclosed in the prior art references include n-butyl acrylate, cyclohexyl acrylate, 2-ethylhexyl acrylate, benzyl acrylate, furfuryl acrylate, ethoxyethoxyethyl acrylate, tricyclodecanyloxyl acrylate, nonylphenyloxyethyl acrylate, 1,3-dioxolan acrylate, hexanediol diacrylate, butanediol diacrylate, neopentylglycol diacrylate, tricyclodecandimethylol diacrylate, trimethylolpropane triacrylate, pentaerythritol tetraacrylate, dipentaerythritol pentaacrylate, dipentaerythritol hexacrylate, diacrylate of polyoxyethylenated bisphenol A, 2-(2-hydroxy-1,1-dimethylethyl)-5-hydroxymethyl-5-ethyl1,3-dioxane diacrylate, 2-(2-hydroxy-1,1-dimethylethyl)-5,5-dihydroxymethyl-1,3-dioxane triacrylate, triacrylate of propyleneoxide addition product of trimethylolpropane, polyacrylate of hydroxypolyether, hexaacrylate of carprolactone addition product of dipentaerythritol, polyacrylate of hydroxypolyether, polyester acrylate and polyurethane acrylate.

Examples of the methacrylate disclosed in the prior art references include methyl methacrylate, butyl methacrylate, ethylene glycol dimethacrylate, butanediol dimethacrylate, neopentylglycol dimethacrylate, trimethylolpropane trimethacrylate, pentaerythritol trimethacrylate, pentaerythritol tetramethacrylate and dimethacrylate of polyoxyalkylenated bisphenol A.

SUMMARY OF THE INVENTION

The applicants studied the polymerizable compound, and found a new polymerizable compound that is advantageously used in the light-sensitive material.

An object of the present invention is to provide a light-sensitive material which forms an image of a high maximum density without causing a stain.

Another object of the invention is to provide a light-sensitive material which forms a clear image even though the heat development conditions are changed.

A further object of the invention is to provide a light-sensitive material which quickly forms a clear color image.

There is provided by the present invention a light-sensitive material which comprises a support and a light-sensitive layer provided thereon, said light-sensitive layer containing silver halide, a reducing agent and a polymerizable compound, wherein the polymerizable compound is a (meth)acrylic ester of an adduct of ditrimethylolpropane with an alkylene oxide, the amount of said alkylene oxide in the adduct being 1 to 10 mole based on one mole of ditrimethylolpropane.

The applicants surprisingly found that a light-sensitive material containing the above-defined new polymerizable compound forms an image of a high maximum density without causing a stain. The high maximum density can be obtained even if the temperature of the heat development process is high. Therefore, the light-sensitive material of the present invention forms a clear image if the heat development conditions are changed. Further, the light-sensitive material of the invention quickly forms a clear color image.

DETAILED DESCRIPTION OF THE INVENTION

The light sensitive material of the present invention is characterized in the new polymerizable compound.

The silver halide, the reducing agent and the specific polymerizable compound are contained in the light-sensitive layer. The light-sensitive layer may comprise two or more layers, for example a silver halide layer containing the silver halide and a polymerizable layer containing the polymerizable compound.

The silver halide, the reducing agent and the polymerizable compound are preferably contained in microcapsules which are dispersed in the light-sensitive layer. The microcapsules preferably further contain a color image forming substance. The microcapsules also preferably further contain a base precursor.

The polymerizable compound of the present invention is preferably represented by the formula [I]:

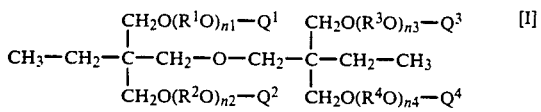

wherein each of $R^1$, $R^2$, $R^3$ and $R^4$ independently is an alkylene group having two or more carbon atoms; each of n1, n2, n3 and n4 independently is an integer of 0 to 10; the sum of n1, n2, n3 and n4 is 1 to 10; each of $Q^1$, $Q^2$, $Q^3$ and $Q^4$ independently is hydrogen, acryloyl or methacryloyl; and at least one of $Q^1$, $Q^2$, $Q^3$ and $Q^4$ is acryloyl or methacryloyl.

Each of $R^1$, $R^2$, $R^3$ and $R^4$ preferably independently is an alkylene group represented by the following formula:

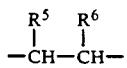

wherein each of $R^5$ and $R^6$ independently is hydrogen or an alkyl group (preferably having one to three carbon atoms).

The sum of n1, n2, n3 and n4 preferably is 1 to 5.

Each of $Q^1$, $Q^2$, $Q^3$ and $Q^4$ preferably independently is acryloyl or methacryloyl.

The polymerizable compound of the present invention is synthesized by preparing an adduct of ditrimethylolpropane with an alkylene oxide (the amount of the alkylene oxide in the adduct is 1 to 10 mole based on one mole of ditrimethylolpropane) and preparing an ester of the adduct with acrylic acid or methacrylic acid.

Examples of the alkylene oxide include ethylene oxide, propylene oxide and butylene oxide. The alkylene oxide preferably is a 3-membered ring (namely, 1,2-epoxide).

In preparation of the adduct, the alkylene oxide is used in an amount of 1 to 10 mole (preferably 1 to 5 mole) based on one mole of ditrimethylolpropane. The addition reaction is preferably conducted by using a catalyst. Examples of the catalyst include NaOH, KOH, Na2CO3, triethylamine, trimethylammonium chloride and tetraethylphosphonium chloride. The temperature of the addition reaction is preferably in the range of the room temperature to 200° C., and more preferably in the range of 50° to 150° C.

The esterification is preferably conducted by using a catalyst in the presence of a polymerization inhibitor. Examples of the catalyst include p-toluenesulfonic acid and sulfuric acid. An example of the polymerization inhibitor is hydroquinone. The temperature of the esterification reaction is preferably in the range of 70° to 130° C. In the esterification reaction, acrylic acid or methacrylic acid is preferably used in an amount of 1 to 10 mole (preferably 3 to 8 mole, and more preferably 4 to 5 mole) based on one mole of the adduct.

Tetraacrylate of an adduct of ditrimethylolpropane with ethylene oxide (the amount of the ethylene oxide in the adduct is 1 to 5 mole based on one mole of ditrimethylolpropane) is particularly preferred.

The above-described compound itself is disclosed in Japanese Patent Provisional Publication No. 64(1989)-68339. This publication describes that the above-described compound is an advantageous component of a printing ink composition. The publication is silent with respect to a photographic or light-sensitive material.

The polymerizable compound is preferably contained in the light-sensitive layer in an amount of 0.01 to 20 g/m², and more preferably in an amount of 0.1 to 10 g/m². The amount of the polymerizable compound is preferably in the range of 0.1 to 1,000 weight parts (more preferably in the range of 0.5 to 100 weight parts) based on 1 weight part of the reducing agent. The polymerizable compound of the present invention can be used in combination with a known polymerizable compound. The details of the known polymerizable compounds are described in Technical Information No. 5, p. 51-55 (Aztech Co., Ltd., Mar. 22, 1991). Further, two or more polymerizable compounds of the invention can be used in combination.

The other components of the light-sensitive material of the invention are described below in detail.

Examples of the silver halide used in the light-sensitive material of the invention include silver chloride, silver bromide, silver iodide, silver chlorobromide, silver chloroiodide, silver iodobromide and silver chloroiodobromide in the form of grains.

The silver halide grains may be of various crystal forms. Examples of the forms include a regular crystal form such as hexahedron, octahedron, dodecahedron or tetradecahedron, an irregular form such as spherical form or tubular form, a form having crystalline defect such as a twinning plane, and a mixed form thereof.

The silver halide grains may be extremely small sized grains having a grain diameter of not more than 0.01 μm, or may be relatively large sized grains having a grain diameter of projected area up to 10 μm. The silver halide emulsion may be a polydispersed emulsion or a monodispersed emulsion (cf., U.S. Pat. Nos. 3,574,628 and No. 3,655,394, and U.K. Patent No. 1,413,748).

A tubular grain having an aspect ratio of not less than approx. 5 can be also employed. The tubular silver halide grains can be easily prepared by processes described in Gutoff, "Photographic Science and Engineering, Vol. 14, pp. 248-257 (1970)", U.S. Pat. Nos. 4,434,226, No. 4,414,310, No. 4,433,048 and No. 4,439,520, and U.K. Patent No. 2,112,157.

As for the crystal structure of the silver halide grains, the individual grains may have a homogeneous halogen composition or a heterogeneous halogen composition. In the heterogeneous grains, the composition varies from the outer surface portion to the inside portion, or may be a multi-layer structure. Otherwise, the silver halide grains may be bonded with other silver halide grains having different halogen composition through epitaxial bonding, or may be bonded with compounds other than the silver halide such as silver rhodanate and lead oxide. Two or more kinds of silver halide grains which differ in halogen composition, crystal habit, grain size, and/or other features from each other can be employed in combination.

The silver halide photographic emulsions employable in the light-sensitive material of the invention can be prepared by processes described, for example, in "Research Disclosure (RD), No. 17,643, pp. 22-23 (Dec. 1978), (Emulsion preparation and types) and No. 18,716, p. 648.

The silver halide emulsion is generally used after subjecting it to physical ripening, chemical ripening and spectral sensitization. Various additives employable in those stages are described in Research Disclosure, No.

17,643 and No. 18,716. The relevant parts in the literature are described below in the form of a table.

Conventional photographic additives employable in the invention are also described in the above-mentioned Research Disclosure, and the relevant parts in the literature are also shown in the following table.

| Additives | RD 17,643 | RD 18,716 |
| --- | --- | --- |
| Chemical sensitizing agent | p. 23 | p. 648 (right side) |
| Sensitivity-increasing agent | | ditto |
| Spectral sensitizing agent and Supersensitizing agent | p. 23-24 | p. 648 (right side)-p. 649 (right side) |
| Anti-fogging agent and Stabilizer | p. 24-25 | p.649 (right side) |

Silver halide is preferably contained in the light-sensitive layer in an amount of 0.001 to 10 g/m$^2$, and more preferably in an amount of 0.05 to 2 g/m$^2$. Silver halide can be used in combination with an organic silver salt. The details of the organic silver salts are described in Technical Information No. 5, p. 17–18 (Aztech Co., Ltd., Mar. 22, 1991).

The reducing agent has a function of reducing silver halide and/or accelerating (or inhibiting) polymerization of the polymerizable compound. Examples of the reducing agent include hydroquinones, catechols, p-aminophenols, p-phenylenediamines, 3-pyrazolidones, 3-aminopyrazoles, 4-amino-5-pyrazolones, 5-aminouracils, 4,5-dihydroxy-6-aminopyrimidines, reductones, aminoreductones, o- or p-sulfonamidophenols, o- or p-sulfonamidonaphthols, 2,4-disulfonamidephenols, 2,4-disulfonamidenaphthols, o- or p-acylaminophenols, 2-sulfonamidoindanones, 4-sulfonamido-5-pyrazolones, 3-sulfonamidoindoles, sulfonamidopyrazolobenzimidazoles, α-sulfonamidoketones and hydrazines.

The reducing agent can be used in the light-sensitive material in an amount of wide range. The amount is preferably in the range of 0.1 to 1,500 mole %, and more preferably in the range of 10 to 300 mole %, based on the amount of the silver salt. The details of the reducing agents are described in Technical Information No. 5, p. 18–35 (Aztech Co., Ltd., Mar. 22, 1991).

There is no specific limitation with respect to the color image forming substance, and various kinds of substances are available. Examples of the color image forming substance include colored substance (i.e., dyes and pigments) and non-colored or almost non-colored substance (i.e., color former or dye or pigment-precursor) which develops to give a color by an external energy (e.g., heating, pressing or light irradiation) or by other components (i.e., color developer).

In the present invention, the color image forming substance preferably is a colored substance such as a dye or a pigment. A pigment is particularly preferred, since a pigment forms a clear transferred image and the color of a pigment is stable to light.

As the dye or pigment used in the invention, there can be mentioned not only those commercially available but also those described in various literatures such as "Handbook of Color Index (C. I.)", Nippon Ganryo Gijutsu Kyokai (ed.), "New Handbook of Pigments (1977)", CMC Shuppan (ed.), "New Application and Technique of Dyes (1986)", and CMC Shuppan (ed.), "Printing Ink Technique (1984)". The details of the color image forming substances are described in Technical Information No. 5, p. 35–50 (Aztech Co., Ltd., Mar. 22, 1991).

The pigment is preferably used in an amount of 5 to 60 parts by weight, based on 100 parts by weight of the polymerizable compound.

A base precursor is preferably used in the light-sensitive material of the present invention. The base precursor includes various inorganic or organic compounds (decarboxylation type, thermal decomposition type, reaction type and complex salt-formation type). Examples of the base precursor are disclosed in U.S. Pat. Nos. 4,835,272, No. 4,939,064, No. 4,970,307 and No. 4,981,965. The details of the base precursors are described in Technical Information No. 5, p. 55–86 (Aztech Co., Ltd., Mar. 22, 1991).

The base precursor preferably releases a base at a temperature in the range of 50° to 200° C., more preferably in the range of 80° to 180° C. The base precursor preferably has a solubility in water of not more than 1% at 25° C. to be incorporated into microcapsules.

In preparation of the microcapsules, a solid base precursor may be directly dispersed in a polymerizable compound. However, it is particularly preferred that a base precursor be dispersed in water, and that the dispersion be then emulsified in a polymerizable compound.

In this case, a nonionic or amphoteric water soluble polymer is preferably dissolved in water in which the base precursor is dispersed.

Examples of the nonionic water soluble polymers include polyvinyl alcohol, polyvinyl pyrrolidone, polyacrylamide, polymethylvinyl ether, polyacryloylmorpholine, polyhydroxyethylacrylate, polyhydroxyethylmethacrylate-coacrylamide, hydroxyethyl cellulose, hydroxypropyl cellulose and methylcellulose. An example of the amphoteric water soluble polymer is gelatin.

The water soluble polymer is preferably used in an amount of 0.1 to 100 weight % based on the amount of the base precursor, and more preferably 1 to 50 weight %. The base precursor is preferably contained in the dispersion in an amount of 5 to 60 weight %, and more preferably of 10 to 50 weight %. The base precursor is preferably used in an amount of 2 to 50 weight % based on the amount of the polymerizable compound, and more preferably 5 to 30 weight %.

The base precursor sometimes influences the color image. The base precursor releases a base, which ionizes a reducing agent. The ionized reducing agent changes the hue of the color image forming substance.

To solve the problems caused by the base precursor, an acidic compound is preferably contained in the light-sensitive layer. The acidic compound is preferably in the form of solid particles which are arranged outside light-sensitive microcapsules containing silver halide, a reducing agent, a polymerizable compound and a base precursor. The compound is also preferably contained in microcapsules, which are different from the light-sensitive microcapsules.

Examples of the acidic compounds include an inorganic acid, an organic acid and a salt of a strong acid with a weak base. An organic acid is particularly preferred. The organic acid preferably has 6 or more carbon atoms. The acidic compound is preferably solid at the room temperature. The compound is also preferably insoluble in water.

The acidic compound preferably has a melting point in the range of 60° to 250° C. Preferred acidic compounds are carboxylic acids, sulfonic acids and phosphoric acids.

Examples of the carboxylic acids include behenic acid, 13-docosenoic acid, oleic acid, linoleic acid, stearic acid, isostearic acid, 2.hexyldecanoic acid, palmitic acid, myristic acid, lauric acid, decanoic acid, octanoic acid, 3,5,5-trimethylhexanoic acid, 1,12-dodecanedicarboxylic acid, sebacic acid, 1-adamantanecarboxylic acid, 1-naphthoic acid, 2-naphthoic acid, pyromellitic acid, p-benzoylaminobenzoic acid, terephthalic acid, isophthalic acid, phthalic acid, benzoic acid, trimellitic acid, 1-hydroxy 2-naphthoic acid, β-oxynaphthoic acid, p-octyloxybenzoic acid, triphenylacetic acid, mandelic acid, perfluorooctanoic acid, p-nitrobenzoic acid, o-benzoylbenzoic acid, 4-sulfamoylbenzoic acid, o-benzoylaminobenzoic acid, 2,6-pyridinedicarboxylic acid, tetrahydrofurantetracarboxylic acid, 2-quinolinecarboxylic acid, 4,4-biphanyldicarboxylic acid, 4-hydroxybiphanyl-3-carboxylic acid, 2-naphthylacetic acid, 2,6-naphthalenedicarboxylic acid, 6-hydroxy-2-naphthoic acid, 1,4,5,8-naphthalenetetracarboxylic acid 1,8-naphthalic acid, 3,4,9,10-perylenetetracarboxylic acid, indole-3-acetic acid, 3,7-dicarboxydiphenyloxidetetrachlorophthalic acid, phthalonic acid, folic acid, benzilic acid, naphthenic acid, diphenylacetic acid and 2,4-dichlorobenzoic acid.

The carboxylic acids represented by the following formulas are also preferred.

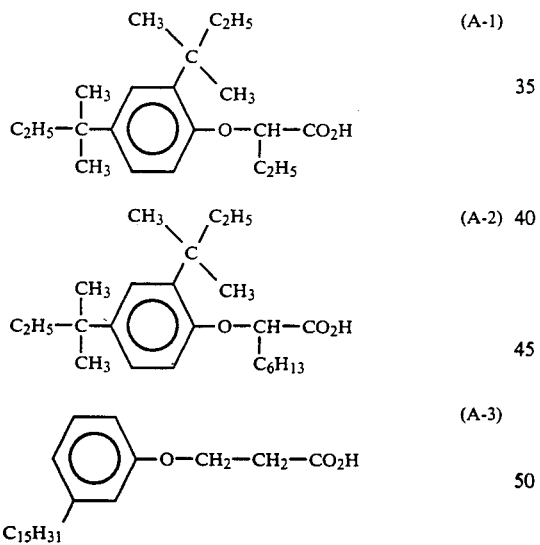

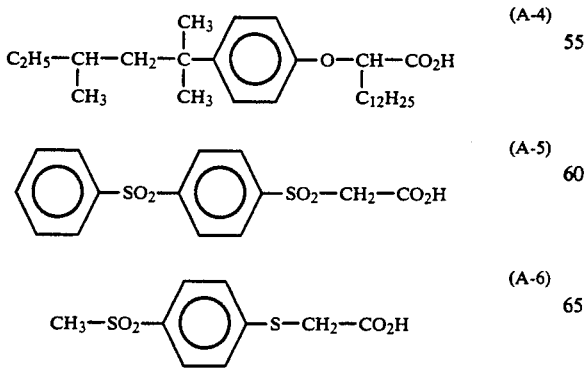

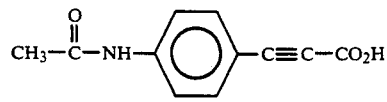

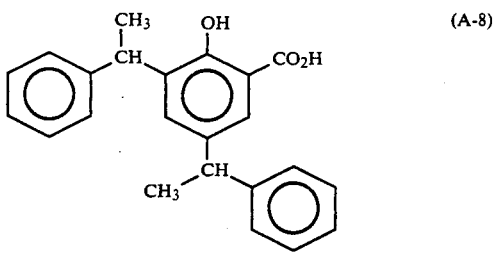

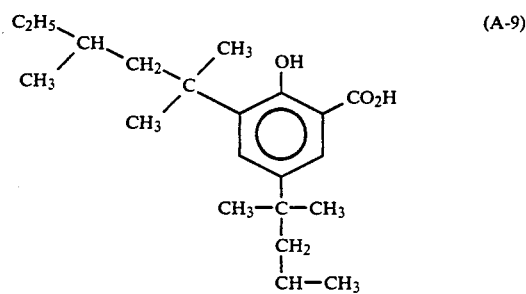

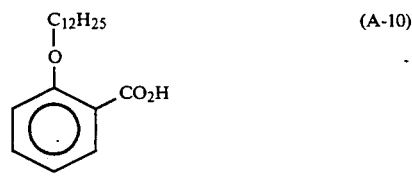

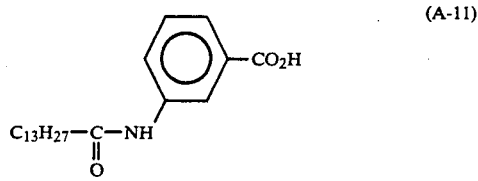

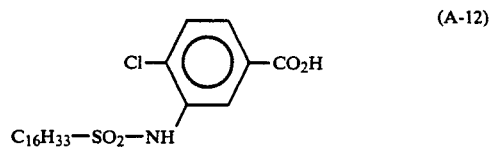

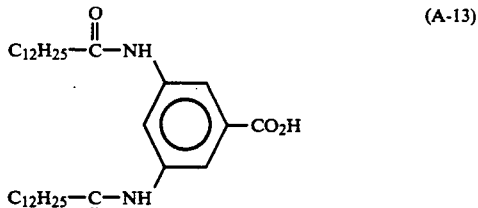

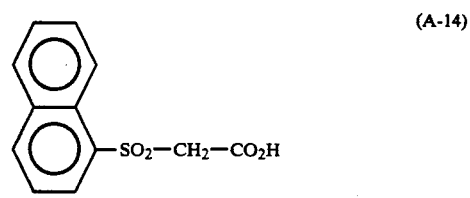

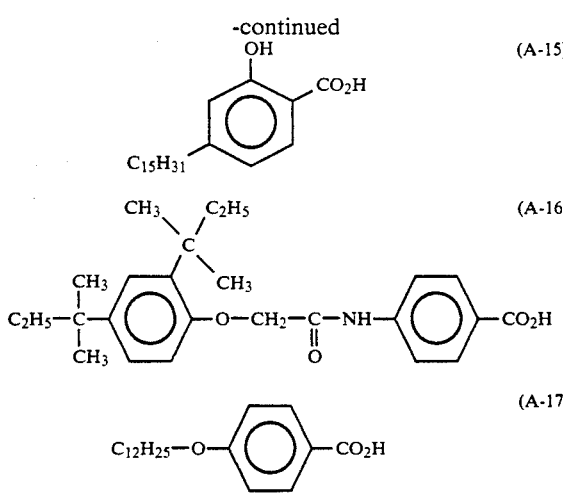

Example of the sulfonic acids include β-naphthalenesulfonic acid, dodecylbenzenesulfonic acid, setyl sulfate, C acid, J acid, γ acid and diaminostilbendisulfonic acid.

Example of the phosphoric acids include acidic phosphates such as stearyl phosphate and lauryl phosphate.

Saccharin is another preferred acidic compound.

an acidic polymer is also available. The acidic polymer has been used as a cation exchange resin. Example of the acidic polymer are represented by the following formulas.

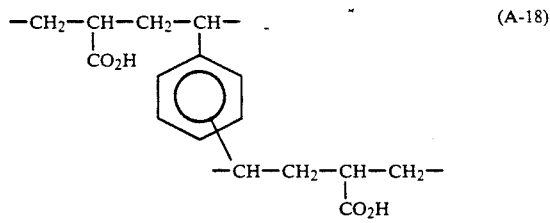

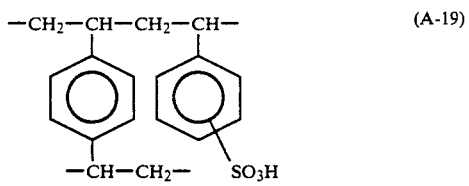

The above-mentioned acidic compounds have already been known, and are commercially available.

The acidic compound is preferably dispersed in an aqueous medium in the case that the acidic compound is in the form of solid particles. The aqueous medium preferably contains a nonionic polymer. Examples of the nonionic polymers include polyvinyl alcohol, polyvinyl pyrrolidone, polyacrylamide, polymethylvinyl ether, polyacryloylmorpholine, polyhydroxyethylacrylate, polyhydroxyethylmethacrylate-co-acrylamide, hydroxyethyl cellulose, hydroxypropyl cellulose and methylcellulose. The particle size of the acidic compound is preferably not more than 10 μm, and more preferably not more than 2 μm.

There is no specific limitation on the preparation of microcapsules containing the acidic compound. The details of the microcapsules are described in Technical Information No. 5, p. 88–98 (Aztech Co., Ltd., Mar. 22, 1991). A polyurea resin shell is particularly preferred. An organic solvent can also be incorporated into the microcapsules. The organic solvent is preferably miscible with the polymerizable compound. The mean particle size of microcapsules containing the acidic compound is preferably in the range of 0.1 to 30 μm, and more preferably in the range of 0.1 to 10 μm.

The amount of the acidic compound is preferably 0.01 to 50 mole, and more preferably 0.1 to 20 mole based on 1 mole of the reducing agent. Two or more acidic compounds can be used in combination.

There is no specific limitation on the preparation of light-sensitive microcapsules containing silver halide, a reducing agent and a polymerizable compound. Any known processes can be employed. The details of the microcapsules are described in Technical Information No. 5, p. 88–98 (Aztech Co., Ltd., Mar. 22, 1991).

With respect to the shell of the microcapsules, a melamine-formaldehyde resin is particularly preferred because this resin forms a rigid microcapsule shell.

A melamine-formaldehyde resin, of which fine microcapsules can be made, is particularly preferred in the invention.

The microcapsules preferably have a polymer shell of a polymeric compound (e.g., a melamine-formaldehyde resin) around a film composed of a reaction product of a water-soluble polymer having a sulfinyl group with an ethylenically unsaturated polymerizable compound. This fine micro-capsule can be preferably employed in the invention.

In the case where aminoaldehyde resins are used for microcapsules, the amount of residual aldehyde is preferably regulated to be below a certain value.

A mean particle size of microcapsules is preferably within the range of 3 to 20 μm. It is preferred that the particle sizes of microcapsules be homogeneously dispersed in the range above a certain value. The ratio of the thickness to the grain size of a microcapsule is preferably within a certain range.

In the case where a silver halide is contained in microcapsules, the above-described mean grain size of the silver halide is preferably not more than one fifth of the mean grain size of microcapsules, and more preferably it is not more than one tenth. A homogeneous and smooth image can be obtained by regulating the mean grain size of the silver halide not to be more than one fifth of the mean grain size of microcapsules.

In the case where a silver halide is contained in microcapsules, the silver halide is preferably contained within the shell of the microcapsule.

When a shell of a microcapsule is formed by dispersing an oily liquid of the polymerizable compound containing a silver halide, a reducing agent, a color image forming substance (optionally used) and a base precursor (or a base) in an aqueous medium, a nonionic or anionic water soluble polymer is preferably contained in the aqueous medium. The amount of oily liquid is preferably within the range of 10 to 120 weight %, more preferably 20 to 90 weight %, based on the amount of the aqueous medium.

Examples of the nonionic water soluble polymers include polyvinyl alcohol, polyvinyl pyrrolidone, polyacrylamide, polymethylvinyl ether, polyacryloylmorpholine, polyhydroxyethylacrylate, polyhydroxyethylmethacrylate-co-acrylamide, hydroxyethyl cellulose, hydroxypropyl cellulose and methylcellulose.

Examples of the anionic water soluble polymers include polystyrenesulfinic acid, a salt of a copolymer of styrenesulfinic acid, a salt of polystyrenesulfonic acid, a copolymer of styrenesulfonic acid, a salt of polyvinyl sulfate, a salt of polyvinylsulfonic acid, a copolymer of maleic anhydride and styrene, and a copolymer of maleic anhydride and isobutylene.

The aqueous medium preferably contains the anionic water soluble polymer in an amount of 0.01 to 5 weight %, and more preferably 0.1 to 2 weight %.

It is particularly preferred to use a water soluble polymer having a few sulfinic groups together with a non-ionic water soluble polymer.

A hydrophilic compound is preferably dissolved in a polymerizable compound to reduce the solubility of the base precursor in the polymerizable compound. Examples of the hydrophilic group of the compound include —OH, —$SO_2NH_2$, —$CONH_2$ and —$NHCONH_2$. Examples of the hydrophilic compound include polyethylene glycol, polypropylene glycol, benzoic amide, cyclohexylurea, octyl alcohol, dodecyl alcohol, stearyl alcohol and stearamide.

An antioxidant can be added to the polymerizable compound to prevent oxidation of the polymerizable compound when the light-sensitive material is preserved or heat-developed. The antioxidants include a phenol antioxidant, a phosphite antioxidant, a sulfur antioxidant and an amine antioxidant. Examples of the phenol antioxidant include 2,2'-methylene-bis-(4-methyl-6-t-butylphenol), 2,6-di-t-butylphenol, 2,2,'-butylidene-bis-(4-methyl-6-t-butylphanol), 2-t-butyl-6-(3'-t-butyl-5'-methyl-2'-hydroxybenzyl)-4-methylphenylacrylate and 4,4'-thio-bis-(3-methyl-6-t-butylphenol). Examples of the phosphite antioxidant include diphenyldecyl phosphite, triphenyl phosphite, tris(2,4-di-t-butylphenyl) phosphite and tris (2-ethylhexyl) phosphite. Examples of the sulfur antioxidant include dilauryl 3,3'-thio-dipropionate, pentaerythritol tetrakis-($\beta$-lauryl-thio-propionate) and thio-dipropionic acid. Examples of the amine antioxidant include phenyl-1-naphthylamine, 6-ethoxy-2,2,4-trimethyl-1,2-dihydroquinoline and dioctyliminodibenzyl.

Examples of the materials used for the support of the light-sensitive material include glasses, ordinary papers, fine paper, baryta paper, coat paper, cast-coat paper, synthetic papers, metals and analogues thereof, films (e.g., polyester) on which metals (e.g., aluminum) are deposited, various films made of polyester, polyethylene, polypropylene, acetyl cellulose, cellulose ester, polyvinyl acetal, polystyrene, polycarbonate, polyethylene terephthalate and polyimide, and papers laminated with resin or polymer (e.g., polyethylene).

The support is preferably made of a polymer film. The thickness of the polymer film support is preferably not more than 50 $\mu$m in view of the heat conductivity.

An undercoating layer is preferably provided between the polymer film support and the light-sensitive layer. A metal (e.g., aluminum film) is also preferably deposited onto the polymer film support.

The most preferable support is a polymer film having a thickness of not more than 50 $\mu$m onto which an aluminum film is provided.

Optional components used for the light-sensitive material are described below. The details of these components are described in Technical Information No. 5, p. 86–88 and 98–144 (Aztech Co., Ltd., Mar. 22, 1991).

The binder employable for the light-sensitive material can be included in the light sensitive layer singly or in combination. A water-soluble binder is preferably employed. A typical water-soluble binder is transparent or semi-transparent one, of which examples include natural substances such as gelatin, gelatin derivatives, cellulose derivatives, starch and gum arabic; and synthetic polymer substances such as polyvinyl alcohol, polyvinyl pyrrolidone and water-soluble polyvinyl compound (e.g., acrylamide polymer). Another example of synthetic polymer substances is a dispersing vinyl compound which increases the size-stability of photographic materials in form of latex.

An antismudging agent used for the light-sensitive material is preferably used in form of solid grains at room temperature. Concrete examples of the antismudging agent employable for the light-sensitive material include starch grains (cf., U.K. Patent No. 1,232,347), fine powder of polymer (cf., U.S. Pat. No. 3,625,736), microcapsules containing no color developing agent (cf., U.K. Patent No. 1,235,991), fine powder of cellulose (cf., U.S. Pat. No. 2,711,357) and inorganic grains such as talc, kaolin, bentonite, pagodite, zinc oxide, titanium oxide, alumina. The mean grain size of the above-mentioned grains is preferably within the range of 3 to 50 $\mu$m, more preferably 5 to 40 $\mu$m, in terms of volume mean diameter. In the case where oily droplets are encapsulated, it is effective that the size of the grain is larger than that of the microcapsules.

Various image formation accelerators can be used for the light-sensitive material.

Image formation accelerators have the functions such as 1) accelerating the transfer of a base or a base precursor, 2) accelerating the reaction of a reducing agent and a silver salt, 3) accelerating the fixing reaction of coloring substances by polymerization. From a viewpoint of physical chemistry concerning the functions, the image formation accelerators can be classified into base or base precursor, nucleophilic compounds, oils, heat solvents, surface active agents, compounds having interactions with silver or silver salts, compounds having deoxidization function and other compounds. However, these substances generally have complex functions, so each of them usually has some acceleration effects, which are described in U.S. Pat. No. 4,678,739 (columns 38–40) and Japanese Patent Provisional Publication No. 62(1987)-209443 in detail.

In the system wherein the polymerizable compound is polymerized within the area where a latent image of silver halide is not formed, a thermal polymerization initiator or a photopolymerization initiator may be contained in the light-sensitive layer. Further, the thermal polymerization initiator or the photopolymerization initiator may also be contained in the image-receiving material to harden the transferred image.

Examples of the thermal polymerization initiator include azo compounds, organic peroxides, inorganic peroxides and sulfinic acids. The thermal polymerization initiator is described in "Addition Polymerization and Ring Opening Polymerization", p. 6–18, edited by the Editorial Committee of High Polymer Experimental Study of the High Polymer Institute, published by Kyoritsu Shuppan (1983).

Examples of the photopolymerization initiator include benzophenones, acetophenones, benzoins and thioxanthones. The photopolymerization initiator is described in "Ultraviolet Ray Hardening System", p. 63–147, edited by the General Technical Center (1989).

Various surface active agents are employable for the light-sensitive material for various purposes, such as aiding the coating process, increasing facility of peeling off, increasing slipperiness, preventing electrification and accelerating development.

An antistatic agent is employable for the light-sensitive materials to prevent electrifying. Antistatic agents are described in Research Disclosure Vol. 176, No. 17643, pp. 27 (Nov. 1978).

To prevent halation and irradiation, a dye or a pigment may be added to the light-sensitive layer of the light-sensitive materials.

The microcapsules may contain a coloring matter having a property of being decolored by heating or irradiation with light. The coloring matter having a property of being decolored by heating or irradiation with light can play the role corresponding to yellow filter in the conventional silver salt photography system.

In the case where a solvent of a polymerizable compound is used for the light-sensitive material, the solvent is preferably contained in microcapsules other than those containing polymerizable compound.

Various anti-fogging agents and photographic stabilizers are employable for the light-sensitive material of the invention. Examples of them include azoles and azaindenes described in Research Disclosure No. 17643, pp. 24-25 (1978), nitrogen-containing carbonic acids and phosphoric acids described in Japanese Patent Provisional Publication No. 59(1984)-168442, mercapto compounds and their salts with metals described in Japanese Patent Provisional Publication No. 59(1984)-111636 and acetylene compounds described in Japanese Patent Provisional Publication No. 62(1987)-87957.

Various development terminators can be employable for the light-sensitive materials to obtain an image of constant quality independent of the temperature and the process of development treatment.

In the specification, "a development terminator" means a compound which interacts with silver or silver salts to inhibit the development, or a compound which neutralizes or reacts with a base to reduce the base concentration to terminate the development. Concrete examples of a development terminator include an acid precursor which emits an acid by heating, an electrophilic compound which substitutes a chlorine atom existing together with by heating, a nitrogen-including heterocyclic compound, a mercapto compound and a precursor thereof.

Other optional components which can be contained in the light-sensitive layer are described in Research Disclosure Vol. 170, No. 17029, pp. 9-15 (Jun. 1978) and the above-described publications.

Examples of an optional layer provided in a light-sensitive material include an image-receiving layer, a heating layer, an anti-electrifying layer, an anti-curling layer, a peeling layer, a cover sheet or a protective layer and an anti-halation layer (a coloring layer).

The light-sensitive materials having a heating layer, having a cover sheet or a protective layer and having an anti-halation layer (a coloring layer) is described in Japanese Patent Provisional Publications No. 61(1986)-294434, No. 62(1987)-210447 and No. 63(1988)-101842, respectively. Further, other optional layers and their concrete embodiments are described in the above-mentioned publications.

An image receiving material is generally used with the light-sensitive material of the invention.

The image-receiving material is described below.

The image-receiving material may comprise a support alone, but preferably an image-receiving layer is provided on the support.

A support of the image-receiving material is not particularly restricted, and materials for the above-described support of a light-sensitive material can be also employed. Examples of them include glasses, ordinary papers, fine paper, coat paper, cast-coat paper, synthetic papers, metals and analogues thereof, various films made of polyester, polyethylene, polypropylene, acetyl cellulose, cellulose ester, polyvinyl acetal, polystyrene, polycarbonate, polyethylene terephthalate and polyimide, and papers laminated with resin or polymer (e.g., polyethylene).

In the case where a porous material such as paper is used as a support of an image-receiving material, the surface of the material preferably has a certain smoothness.

An image-receiving layer of an image-receiving material comprises a white pigment, a binder and other additives. A white pigment itself or space among the white pigment grains accents a polymerizable compound.

Examples of the white pigment used for an image-receiving layer include inorganic white pigments such as oxides (e.g., silicon oxide, titanium oxide, zinc oxide, magnesium oxide and aluminum oxide), salts of alkaline earth metals (magnesium sulfate, barium sulfate, calcium sulfate, magnesium carbonate, barium carbonate, calcium carbonate, calcium silicate, magnesium hydroxide, magnesium phosphate and magnesium hydrogenphosphate), aluminum silicate, aluminum hydroxide, zinc sulfide, various kinds of clay, talc, kaolin, zeolite, acid clay, soluble clay and glass; organic white pigments such as polyethylene, polystyrene, benzoguanamine resin, urea-formalin resin, melamine-formalin resin and polyamide resin. The white pigment above-described can be used in the invention singly or in combination. A white pigment which can absorb a high amount of a polymerizable compound is preferably used.

As the binder, a water-soluble polymer, a polymer latex and a polymer soluble in an organic solvent are employed. Examples of the water-soluble polymer include cellulose derivatives such as carboxymethylcellulose, hydroxyethylcellulose and methylcellulose; proteins such as gelatin, phthalated gelatin, casein and egg albumin; starch and its derivatives such as dextrin and etherificated starch; synthetic polymers such as polyvinyl alcohol, partial acetal of polyvinyl alcohol, poly-N-vinyl pyrrolidone, polyacrylic acid, polymethacrylic acid, polyacrylamide, polyvinyl imidazole, polyvinyl pyrazole and polystyrenesulfonic acid; and others such as locust bean gum, pullulan, gum arabic and sodium alginate.

Examples of the polymer latex include styrene-butadiene copolymer latex, methyl methacrylate-butadiene copolymer latex, polyacrylate latex, polymethacrylate latex, acrylate-methacrylate copolymer latex and ethylene-vinyl acetate copolymer latex.

Examples of the polymer soluble in an organic solvent include polyester resin, polyurethane resin, polyvinyl chloride resin and polyacrylonitrile resin.

The binders can be used singly or in combination. A combination of two or more binders can be employed to cause a phase separation in the image-receiving layer.

A mean grain size of the white pigment is within a range of 0.1 to 20 μm, preferably 0.1 to 10 μm. The amount of the pigment is in the range of 0.1 to 60 g, preferably 0.5 to 30 g. The weight ratio of the white pigment to a binder preferably is in the range of 0.01 to 0.4, and more preferably 0.03 to 0.3.

The image-receiving layer may further contain various components other than the white pigment and the binder.

For example, a color developer can be contained in the image-receiving layer in a color formation system in which a color former and the color developer are used. Examples of the color developer include phenols, organic acids and salts, and esters. Zinc salt of a salicylic acid derivative is preferred in the case where a leuco dye is used as a color image forming substance (color former). Zinc salt of 3,5-di-α-methylbenzylsalicylic acid is particularly preferred.

The color developer is preferably contained in the image-receiving layer in a coating amount of 0.1 to 50 $g/m^2$, and more preferably 0.5 to 20 $g/m^2$.

A thermoplastic compound may be contained in the image-receiving layer. In the case where the thermoplastic compound is contained in the image-receiving layer, the image-receiving layer itself is preferably composed of an agglomerate of fine particles of the thermoplastic compound (i.e., granular thermoplastic compound). The image-receiving layer having this constitution has such advantages that the formation of a transferred image can be readily done and that a glossy image can be obtained under heating after the image formation. There is no specific limitation on the thermoplastic compounds, and any known thermoplastic resins (plastics) and waxes can be employed.

The glass transition point of the thermoplastic resin or the melting point of the wax is preferably not higher than 200° C.

A photopolymerization initiator or a thermal polymerization initiator may be contained in the image-receiving layer. In the image forming method using the image-receiving material, the color image forming substance is transferred onto the image-receiving material together with the unpolymerized polymerizable compound. Therefore, the photopolymerization initiator or the thermal polymerization initiator can be incorporated into the image-receiving layer to cure the unpolymerized polymerizable compound smoothly.

Next, below described are the steps of the image forming method in which the light-sensitive material of the invention is used. The steps include: imagewise exposing the light-sensitive material; simultaneously or thereafter heating the material from the side of the support (the side on which the light-sensitive layer is not provided); superposing and pressing a light-receiving material on the surface of the light-sensitive layer provided on the light-sensitive material.

Various exposure means can be employed in the imagewise exposure. The light-sensitive material is imagewise exposed to a radiation containing visible light to obtain a latent image of the silver halide. The kind of light source or the amount of radiation employed in the exposure can be selected depending on a light-sensitive wavelength (or intensified wavelength in the case of spectral sensitization) of the silver halide and a sensitivity of the light-sensitive material.

Examples of the radiation include natural light, ultraviolet light, visible light and infrared light. Examples of such low energy radiation light source include a fluorescent lamp, a tungsten lamp, a halogen lamp, a xenon flash lamp, various lasers (e.g., a gas laser, a solid laser, a chemical laser and a semiconductor laser), a light emission diode, a plasma emitting tube and FOT. A high energy radiation such as X-ray, γ-ray and electron beam is also available in special cases.

In the case where a full color image is formed, the light-sensitive material contains two or more microcapsules which are different from each other with respect to the spectral sensitivity. Accordingly, the light-sensitive material is exposed to two or more spectral lights to form a full color image.

The light source should be selected in consideration of the light-sensitive wavelength as is mentioned above. Further, it is preferably considered whether the image information is converted into an electrical signal or not (digital or analog). The processing speed of the system, the sizes of the image recording apparatus and the electric power of the apparatus are also important factors in the selection of the light source.

In the case where the image information is not converted into an electrical signal (for example, when a subject such as a landscape and a portrait is directly photographed, when an original image is directly copied, or when a positive such as a reversal film is exposed to light), exposure devices for a camera, a printer, an enlarging apparatus and a copying machine are available. A two-dimensional image can be exposed to light by one shot using this exposure device. Further, the image can also be scanned through a slit. An original image can be enlarged or reduced. In this case, a fluorescent lamp or a tungsten lamp is a preferred light source. However, a monochromatic light such as a laser is also available if two or more lights are used in combination.

In the case where the image information is an electrical signal, two or more monochromatic lights such as a light emission diode or a laser can be used in combination as a light source. The combination is determined in consideration of the spectral sensitivity of the heat developing color light-sensitive material. Further, various known display devices (CRT, liquid crystal display, electroluminescence display, electrochromic display and plasma display) are also available. In this case, the image information is an image signal such as a signal obtained by a video camera or an electron still camera, a television signal (e.g., a signal regulated by Japan Television Signal Standards (NTSC)), a signal consisting of many image elements obtained by scanning an original image, and a signal stored in a recording material such as a magnetic tape or disk.

In the case of the exposure of a color image, two or more monochromatic lights are used in combination in consideration of the spectral sensitivity of the light-sensitive material. In this case, two or more light sources such as LED, a laser and a fluorescent lamp may be used in combination. The light sources may be the same or different. The spectral sensitivity of the light-sensitive material usually contains R (Red), G (Green) and B (Blue). Light sources of UV (Ultraviolet) and IR (Infrared) have also recently been available. In addition to the combination of R, G and B, examples of the combination of the spectral sensitivity include (G, R, IR), (R, short wave IR, long wave IR), (short wave UV, medium wave UV, long wave UV) and (UV, B, G). A combination of different light sources such as two kinds of LED and a laser is available.

A light emitting tube or element can be used in a scanning exposure with respect to individual colors. Arrays such as a LED array, a liquid crystal shutter array and a magneto-optical element shutter array can be used to increase the speed of the exposure.

The display devices such as CRT include a monochromatic device and a color device. If a multiple exposure is carried out using some filters, even a monochromatic device can form a color image. Such system is also available.

A conventional two-dimensional display device can be used as a one-dimensional device such as FOT. In the case where the display device and a scanner are used in combination, the displayed image can be divided into two or more parts.

In the above-mentioned imagewise exposure process, a latent image is formed in the silver halide contained in microcapsules.

Simultaneously or after the imagewise exposure process, a heating process to develop the image is carried out in the image forming method in which the light-sensitive material of the invention is used.

It is difficult for conventional methods to shorten the development process. Therefore the light-sensitive material of the invention is heated from the side of the support (the side on which the light-sensitive layer is not provided).

Heating in the heat development process can be conducted in various known manners. For example, a heating layer which is arranged on the light-sensitive material can be used as the heating means. Further, the light-sensitive material can be heated on a hot plate, an iron or a heat roller. Furthermore, the material can be heated between a heat roller and a belt.

The whole surface of the light-sensitive material may be heated by a heater which is larger than the light-sensitive material. The light-sensitive material may also be heated by scanning the material with a small heater (e.g., hot plate, heat roller, heat drum).

Further, the light-sensitive material can be heated although the material is not in contact with a heater. For example, the light-sensitive material may be heated with an electromagnetic wave, an infrared ray or a hot air.

In the present invention, the light-sensitive material is heated from the side of the support (the side on which the light-sensitive layer is not provided). The side of the light-sensitive layer is usually open to the air. However, the side of the layer may be covered with an adiabatic material to maintain the heating temperature. In this case, it is necessary to handle carefully the adiabatic material. If the adiabatic material is pressed on the light-sensitive material at a high pressure (10 kg/cm$^2$ or more), the microcapsules contained in the light-sensitive layer tend to be ruptured.

After the light-sensitive material is imagewise exposed to light, the light-sensitive material is heated preferably at an interval of 0.1 second or more. The heating temperature usually ranges from 60° C. to 250° C., preferably from 80 ° C to 180 ° C. The heating time is usually in the range of 0.1 to 20 seconds, and preferably in the range of 0.1 to 5 seconds.

A color image can be obtained on an image-receiving material by pressing the light-sensitive material on the image-receiving material to transfer the unpolymerized polymerizable compound to the image-receiving material.

For applying a pressure to the light-sensitive material and the image-receiving material, any known pressing methods can be employed.

For example, the light-sensitive material and the image-receiving material may be sandwiched between press plates such as a presser or they may be transferred using a pressure roller such as a nip roll to apply a pressure to them. A dot-impact device can be also employed to give intermittently a pressure to them.

Otherwise, a pressure may be applied to the light-sensitive material and the image-receiving material by spraying a high-pressure air by means of an air gun or using an ultrasonic wave-generating device or a piezoelectric element.

The light-sensitive material and the image-receiving material are preferably pressed at a pressure of not less than 500 kg/cm$^2$, and preferably not less than 800 kg/cm$^2$. In the case that the light-sensitive material is pressed while heating at a temperature in the range of 40° to 120° C., the pressure may be not more than 500 kg/cm$^2$.

The light-sensitive material of the invention can be used for color photography, printing and copy (e.g., computer-graphic hard copy and xerox copy). The present invention provides a compact and inexpensive image forming system such as a copying machine and a printer.

EXAMPLE 1 Preparation of Silver Halide Emulsion (EB-1)

To 900 ml of distilled water was added 24 g of lime-treated inert gelatin, and dissolved at 40° C. over 1 hour. To the resulting solution was added 3 g of NaCl, and then the pH was adjusted to 3.2 using 1N-sulfuric acid.

To the obtained gelatin solution, 10 mg of the following compound (AGS-1). To the mixture, the following Liquids I and II were added at the constant pAg value of 8.5 at 60° C. over 45 minutes (all of Liquid I was added to the mixture) according to the control double jet method. After that, the pH value was adjusted to 6.0 using 1N NaOH. To the mixture were added 6.4 mg of the following compound (AZ-1) and 4.8 mg of the following compound (AZ-2), and the mixture was ripened at 60° C. for 60 minutes. To the mixture was further added 480 mg of the following compound (SB-1). After 20 minutes, to the resulting mixture was further added 100 ml of an aqueous solution containing 4.1 g of KI at the same feed rate over 3 minutes.

To the resulting emulsion was then added 1.1 g of the following compound (CK-1) to form sediment. After the emulsion was washed with water for desalting, 6.0 g of lime-treated gelatin was added and dissolved in the emulsion. Then, to the emulsion was further added 3 ml of 72% aqueous solution of the following compound (ATR-3). The pH was adjusted to 6.2.

Thus, a monodispersed tetradecahedral silver iodobromide emulsion (EB.1) (yield: 550 g, mean grain size: 0.24 μm, distribution coefficient: 20%) was prepared.

| Liquid I: | AgNO$_3$ | 120 g |
|---|---|---|
| | distilled water | 550 ml |
| Liquid II: | KBr | 85 g |
| | distilled water | 550 ml |

Preparation of Silver Halide Emulsion (EG-1)

The procedure of the preparation of silver halide emulsion (EB-1) was repeated except that Liquids I and II were added over 15 minutes and 450 mg of the following compound (SG-1) was used in place of the compound (SB-1).

Thus, a monodispersed silver iodobromide emulsion (EG-1) (yield: 550 g, mean grain size: 0.18 μm, distribution coefficient: 20%) was prepared.

Preparation of Silver Halide Emulsion (ER-1)

The procedure of the preparation of silver halide emulsion (EG-1) was repeated except that Liquids I and II were added over 15 minutes and 450 mg of the following compound (SR-1) and 100 mg of the following compound (SR-2) were added in place of the compound (SB-1).

Thus, a monodispersed silver iodobromide emulsion (ER-1) (yield: 550 g, mean grain size: 0.18 μm, distribution coefficient: 22%) was prepared.

5% aqueous solution of polyethylene glycol (average molecular weight: 2,000), 70 g of the base precursor (BD-1) and 200 ml of glass beads (diameter: 0.5–0.75 mm). The resulting mixture was stirred at 3,000 r.p.m. for 30 minutes using a Dynomill, and then the pH value was adjusted to 6.5 using 2N sulfuric acid to obtain a solid dispersion (KB-1) of the base precursor (BG-1). The grain size of the base precursor was not more than 1.0 μm.

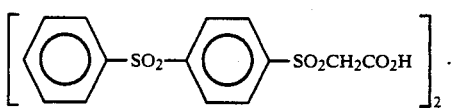

(BG-1)

(AGS-1)

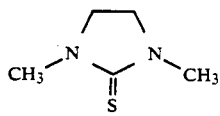

(AZ-1) Na$_2$S$_2$O$_3$.5H$_2$O (AZ-2) HAuCl$_4$.4H$_2$O

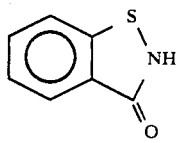

(ATR-3)

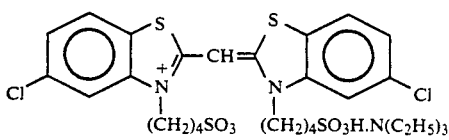

(SB-1)

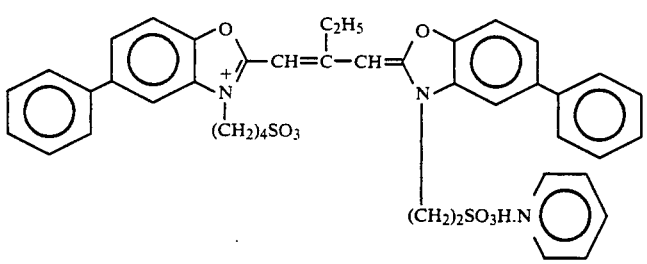

(SG-1)

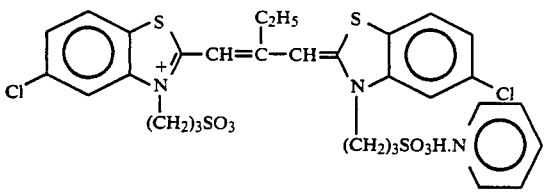

(SR-1)

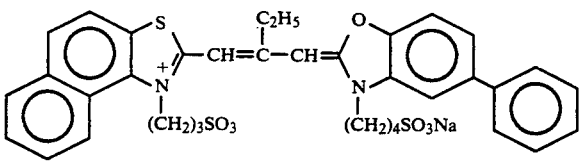

(SR-3)

Poly(isobutylene-co-monosodium maleate)   (CK-1)

Preparation of Solid Dispersion (KB-1)

Into a 300 ml dispersion container were added 110 g of 5.4% aqueous solution of lime-treated gelatin, 20 g of

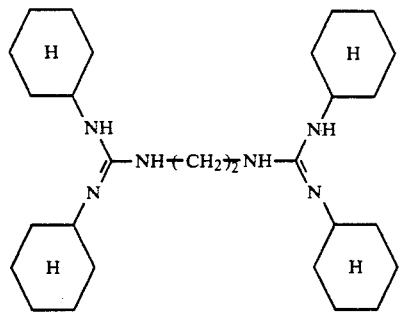

Preparation of Pigment Dispersion (GY-1)

To 225 g of the polymerizable compound (MN-1) was added 45 g to Chromofine Yellow 5900 (tradename, available from Dianichiseika Color & Chemicals Mfg. Co., Ltd.). The resulting mixture was stirred at 5,000 r.p.m. for 1 hour using Eiger Motor Mill (tradename of Eiger Engineering) to obtain a pigment dispersion (GY-1).

Preparation of Light-Sensitive Composition (PG-1)

To 45 g of the pigment dispersion (GM-1) were dissolved 9 g of 10 wt. % solution of copolymer (1P-1) in (SV-1), 2.3 g of (RD.1), 3.1 g of (RD.3), 2 g of 0.5 wt. % solution of (FF-3) in (SV-1) and 0.5 g of (ST-1).

To the resulting oily solution, 7.6 g of the silver halide emulsion (EG-1) and 24 g of the solid dispersion (KB-1) were added, and the resulting mixture was stirred at 10,000 r.p.m. for 5 minutes at 60° C. using a dissolver of 40 $\phi$ to obtain a light-sensitive composition (PG-1) in the form of a W/O emulsion.

Preparation of Light-Sensitive Composition (PR-1)

To 45 g of the pigment dispersion (GC-1) were dissolved 9 g of 10 wt. % solution of copolymer (1P-1) in (SV-1), 2.3 g of (RD-1), 3.1 g of (RD-2), 2 g of 0.5 wt. % solution of (FF-3) in (SV-1) and 0.5 g of (ST-1).

To the resulting oily solution, 7.6 g of the silver halide emulsion (ER-1) and 24 g of the solid dispersion (KB-1) were added, and the resulting mixture was stirred at 10,000 r.p.m. for 5 minutes at 50° C. using a dissolver of 40 $\phi$ to obtain a light-sensitive composition (PR-1) in the form of a W/O emulsion.

Polymerizable compound (MN-1)

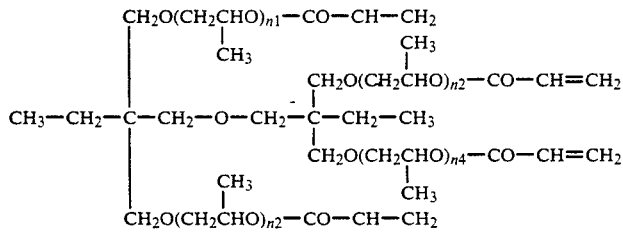

($n1 + n2 + n3 + n4 = 2$, available from Nippon Kayaku Co., Ltd.)

Preparation of Pigment Dispersion (GM-1)

In 255 g of the polymerizable compound (MN-1) were added 30 g of Rubin F6B (tradename of Hext). The mixture was stirred at 5,000 r.p.m. using Eiger Motor Mill (tradename of Eiger Engineering) for 1 hour to obtain a pigment dispersion (GM-1).

Preparation of Pigment Dispersion (GC-1)

In 255 g of the polymerizable compound (MN-1) were added 45 g of copper phthalocyanine (C.I. Pigment 15), 1.13 g of Solsperse 5000 (tradename of ICI) and 3.37 g of Solsperse 24000 (tradename of ICI). The mixture was stirred at 5,000 r.p.m. using Eiger Motor Mill (tradename of Eiger Engineering) for 1 hour to obtain a pigment dispersion (GC-1).

Preparation of Light-Sensitive Composition (PB-1)

To 45 g of the pigment dispersion (GY-1) were dissolved 9 g of 10 wt.% solution of copolymer (1P-1) in (SV-1), 2.3 g of (RD-1), 3.1 g of (RD.3), 2 g of 0.5 wt. % solution of (FF-3) in (SV-1) and 0.5 g of (ST-1).

To the resulting oily solution, 7.6 g of the silver halide emulsion (EB.1) and 24 g of the solid dispersion (KB-1) were added, and the resulting mixture was stirred at 10,000 r.p.m. for 5 minutes at 60° C. using a dissolver of 40 $\phi$ to obtain a light-sensitive composition (PB-1) in the form of a W/O emulsion.

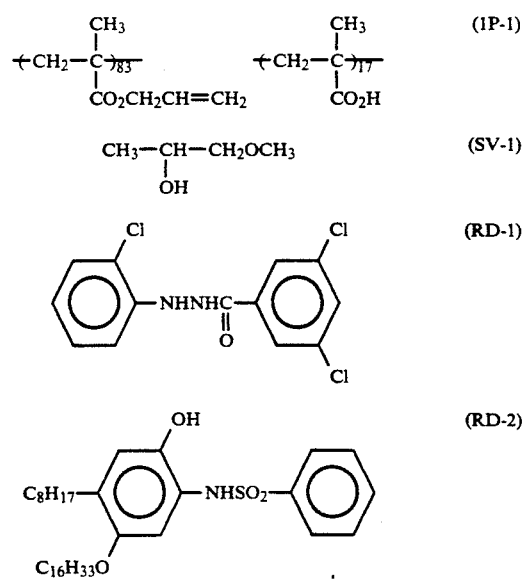

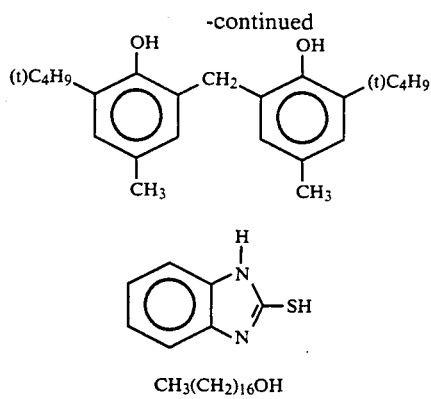

(RD-3)

(FF-3)

CH₃(CH₂)₁₆OH (ST-1)

Preparation of Microcapsule Dispersion (CB-1)

To 4 g of 15% aqueous solution of the following polymer (2P-1) was added to 46 g of water, and then the pH was adjusted to 5.0 using 2N sulfuric acid. To the resulting mixture was added 50 g of 10% aqueous solution of the following polymer (2P-2) and the obtained mixture was stirred at 60° C. for 30 minutes. Then the above-mentioned light-sensitive composition (PB-1) was added to the mixture and the resulting mixture was stirred at 6,000 r.p.m. for 20 minutes at 60° C. using a dissolver of 40 φ to obtain a W/O/W emulsion.

Independently, to 31.5 g of melamine were added 52.2 g of 37% aqueous solution of formaldehyde and 170.3 g of water, and the resulting mixture was stirred at 60° C. for 30 minutes to obtain a transparent melamine-formaldehyde precondensate.

To the above-prepared W/O/W emulsion cooled at 40° C. was added 25 g of the above-prepared precondensate. While the resulting mixture was stirred at 1,200 r.p.m. using a propeller mixer, the pH was adjusted to 5.0 using 2N sulfuric acid. The mixture was then heated to 70° C. over 30 minutes, and then further stirred for 30 minutes. Further, to the mixture was added 10.3 g of 40 % aqueous solution of urea, and the mixture was adjusted to pH 3.5 using 2N sulfuric acid and stirred at 70° C. for 40 minutes. Then the mixture was cooled to 40° C. To the mixture was added 9 g of 3% aqueous solution of K-carrageenan. The mixture was stirred for 10 minutes and adjusted to pH 6.5 using 2N aqueous solution of sodium hydroxide. Thus, a light-sensitive microcapsule dispersion (CB.1) was prepared.

Preparation of Microcapsule Dispersion (CG-1)

To 4 g of 15% aqueous solution of the polymer (2P-1) was added 36 g of water, and then the pH was adjusted to 5.0 using 2N sulfuric acid. To the resulting mixture was added 60 g of 10% aqueous solution of the polymer (2P-2) and the obtained mixture was stirred at 60° C. for 30 minutes. Then the above-mentioned light-sensitive composition (PG-1) was added to the mixture and the resulting mixture was stirred at 6,000 r.p.m. for 20 minutes at 60° C. by means of a dissolver of 40 φ to obtain a W/O/W emulsion.

Then the procedure of the preparation of (CB-1) was repeated to prepare a light-sensitive microcapsule dispersion (CG-1).

Preparation of Microcapsule Dispersion (CR-1)

To 4 g of 15% aqueous solution of the polymer (2P-1) was added 46 g of water, and then the pH was adjusted to 5.0 using 2N sulfuric acid. To the resulting mixture was added 50 g of 10% aqueous solution of the polymer (2P-2) and the obtained mixture was stirred at 60° C. for 30 minutes. Then the above-mentioned light-sensitive composition (PR-1) was added to the mixture and the resulting mixture was stirred at 6,000 r.p.m. for 20 minutes at 60° C. by means of a dissolver of 40 φ to obtain a W/O/W emulsion.

Then the procedure of the preparation of (CB-1) was repeated to prepare a light-sensitive microcapsule dispersion (CR-1).

Polymer (2P-1)
  Potassium polyvinylbenzenesulfinate
Polymer (2P-2)
  Polyvinyl pyrrolidone (K-90)

Preparation of Light-Sensitive Material 101

To a mixture of 15 g of the light-sensitive microcapsule dispersion (CB-1), 15 g of the light-sensitive microcapsule dispersion (CG-1) and 15 g of the light-sensitive microcapsule dispersion (CR-1) were added 6.5 g of 5% aqueous solution of the following surface active agent (WW-1), 8 g of 1% aqueous solution of the following surface active agent (WW-2), 16 g of 10% aqueous solution of carboxyl modified polyvinyl alcohol (tradename: PVA KL 318, available from Kuraray Co., Ltd.) and 9 g of 10% aqueous solution of glycerol. The resulting mixture was stirred at 40° C. for 10 minutes. The mixture was filtered from a mesh of 44 μm to to prepare a coating solution.

With 100 ml/m² of the prepared coating solution, a thin aluminum layer deposited on a polyethylene terephthalate film (thickness: 25 μm) was coated according to an extrusion method. Then the coated layer of the solution was dried at 60° C. The dried coated film was rolled up under the conditions of 25 ° C. and 65% so that the coated surface might be inside. Thus, a light-sensitive material 101 was prepared.

Surface active agent (WW-1)

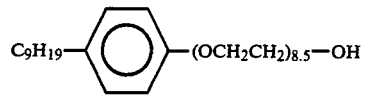

Surface active agent (WW-2)

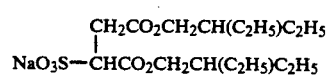

Preparation of Light-Sensitive Materials 102 to 104

Light-sensitive materials 102 to 104 were prepared in the same manner as in the preparation of the light-sensitive material 101 except that the polymerizable compounds (MN-2), (MN-3) and (MN-4) were respectively used in place of the polymerizable compound (MN-1).

Polymerizable compound (MN-2)

-continued

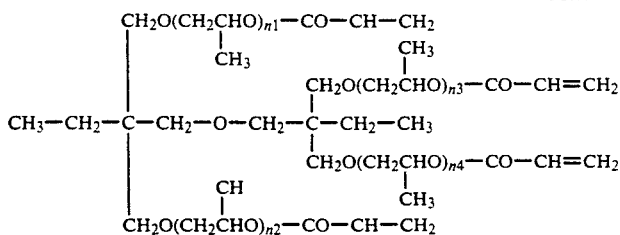

(n1 + n2 + n3 + n4 = 4, available from Nippon Kayaku Co., Ltd.)

Polymerizable compound (MN-3)

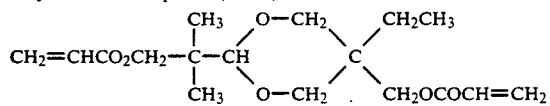

(Trade name: Cayalad R604 available from Nippon Kayaku CO., Ltd.)

Polymerizable compound (MN-4)

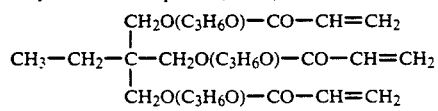

(Trade name: Alonix M310 available from Toagosei Chemical Industry Co., Ltd.)

Preparation of Image-Receiving Material (RS-1)

A mixture of 240 g of calcium carbonate (tradename: PC700, available from Shiraishi Industrial Co., Ltd.), 5.6 g of z surface active agent (poize 520, available from Kao Co., Ltd.) and 354.4 ml of water was stirred at 8,000 r.p.m. for 3 minutes using a dispersing device (tradename: Ultra Disperser LK-41, Yamato Science Co., Ltd.). To 52 g of the resulting dispersion was added 40 g of 10% aqueous solution of polyvinyl alcohol (tradename: PVA-117, available from Kuraray Co., Ltd.), and then 4 ml of 1% aqueous solution of the following surface active agent and 22 ml of water were further added. Thus a coating solution for an image-receiving layer was prepared.

Surface active agent

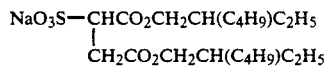

The coating solution was uniformly applied onto a paper having a basis weight of 80 g/m$^2$ (i.e., a paper having a fiber length distribution [defined by JIS-P-8207] in which the sum of weight percent of 24 mesh residue and 42 mesh residue is within a range of 30-60%, as described in U.S. Pat. No. 4,871,643) in an amount of 65 g/m$^2$, and the coated layer of the solution was dried at 60° C. to prepare an image-receiving material (RS-1).

Image Formation and Evaluation Thereof

Each of the light-sensitive materials 101 to 104 was exposed to light at 5,000 lux for 1 second at color temperature of 3,100° K. using a halogen lamp through a wedge in which the transmission density is changed from 0 to 4.0. After 10 minutes, the exposed light-sensitive materials were then heated on a drum at 150° C. from the side of the support for 1.5 second. Each of the light-sensitive materials was pressed on the image-receiving material (RS-1) by a pressure roller (diameter: 3 cm, surface temperature: 60° C.) at the pressure of 400 kg/cm$^2$ while the materials were moving at the speed of 2 cm/sec.

The light-sensitive material was then removed from the image-receiving material to form a clear positive image on the image-receiving material. The density of the image was measured using x-Rite 310. The results are set forth in Table 1. In Table 1, the Maximum Density and the Minimum Density are visual densities.

TABLE 1

| Light-sensitive Material | Polymerizable Compound | Maximum Density | Minimum Density |
| --- | --- | --- | --- |
| 101 | MN-1 | 1.35 | 0.08 |
| 102 | MN-2 | 1.30 | 0.09 |
| 103 | MN-3 | 1.12 | 0.20 |
| 104 | MN-4 | 1.05 | 0.35 |

As is evident from the results of Table 1, the light-sensitive materials 101 and 102 of the present invention quickly form a clear image having a high maximum density and a low minimum density.

EXAMPLE 2

Light-sensitive materials 201 to 204 were prepared in the same manner as in preparation of the light-sensitive materials 101 to 104 respectively except that the following reducing agent (RD-4) was used in place of the reducing agent (RD-1). The amount of the reducing agent (RD-4) was the same mole as the amount of the reducing agent (RD-1) used in Example 1.

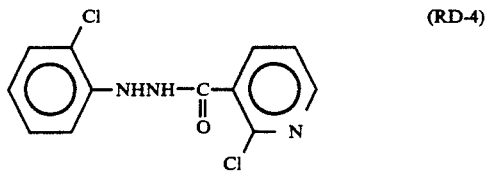
(RD-4)

The light-sensitive materials 201 to 204 were evaluated in the same manner as in Example 1. As the result, the light-sensitive materials 201 and 202 of the present invention form a clear image having a high maximum density and a low minimum density, compared with the light-sensitive materials 203 and 204.

EXAMPLE 3 Preparation of Aluminum Support

A surface of an aluminum sheet having a thickness of 0.30 mm was ground using a nylon brush and an aqueous suspension of pumice stone of 400.in mesh, and then sufficiently washed out with water. The aluminum sheet was then immersed for etching in 10 % aqueous solution of sodium hydroxide at 70° C. for 60 seconds. The sheet was then washed out with running water, then neutralized with 20% aqueous solution of nitric acid and washed out with water. The aluminum sheet was subjected to an electrolytic surface-roughening treatment in 1% aqueous solution of nitric acid in an electric anode amount of 160 coulomb/dm$^2$ using sine wave alternating-corrugated current under such conditions as an anode voltage of 12.7 V and an electric cathode amount ratio to an electric anode amount of 0.8. The center line average height (Ra) of the aluminum sheet was 0.6 μm. Subsequently, the aluminum sheet was immersed in 30% aqueous solution of sulfuric acid at 55° C. for 2 minutes to remove smuts, and then subjected to anodizing in a 20% aqueous solution of sulfuric acid at a current density of 2 A/dm$^2$ to give an anodized layer having a thickness of 2.7 g/dm$^2$.

Preparation of Polymerizable Layer

The following coating solution was coated over the aluminum support, and the coated layer of the solution was dried to form a polymerizable layer having a dry thickness of about 1.3 μm on the support.

| (Coating solution) | |
|---|---|
| Polymerizable compound (MN-1) | 2.5 g |
| Reducing agent (RD-1) | 2.0 g |
| 20 Weight % propylene glycol monomethyl ether solution of allyl methacrylate/methacrylic acid copolymer (copolymerization ratio = 83/17) | 37.5 g |
| The following pigment dispersion | 12.0 g |
| Methyl ethyl ketone | 74.0 g |
| (Pigment dispersion) | |
| Chromophthal-Red A2B | 18 g |
| Benzyl methacrylate/methacrylic acid copolymer (copolymerization ratio = 80/20) | 12 g |
| Cyclohexanone | 30 g |
| Propylene glycol monomethyl ether | 40 g |

Preparation of Silver Halide Emulsion

In 1,500 ml of water were dissolved 16 g of gelatin and 0.5 g of sodium chloride, and the resulting gelatin solution was adjusted to pH 3.2 using 1N-sulfuric acid and was kept at 50° C. To the gelatin solution, 300 ml of an aqueous solution containing 71 g of potassium bromide and 300 ml of an aqueous solution containing 0.59 mole of silver nitrate were added simultaneously at the same feed rate over 50 minutes. After 1 minute, to the resulting mixture was further added 200 ml of an aqueous solution containing 4.3 g of potassium iodide at a fixed feed rate over 5 minutes. To the resulting emulsion was then added 1.2 g of a polyisobutylene/monosodium maleate copolymer.

After the emulsion was washed out with water for desalting, 24 g of gelatin was added to the emulsion. Further, to the resulting emulsion were added 5 mg of sodium thiosulfate and 0.5 g of the sensitizing dye (SG-1) used in Example 1 to chemically sensitize the emulsion at 60° C. for 15 minutes. Thus, a silver halide emulsion (yield: 1,000 g) was obtained.

Preparation of Base Precursor Dispersion

In 750 g of 3wt. % aqueous solution of polyvinyl alcohol was dispersed 250 g of the following powdery base precursor using Dynomill dispersing device. The particle size of the base precursor was about not more than 0.5 μm.

(Base precursor)

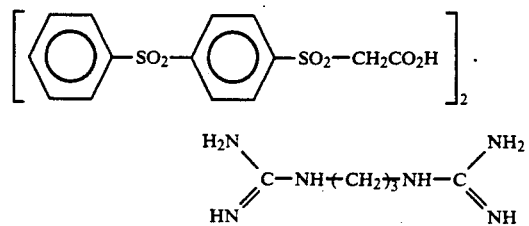

Preparation of Light-Sensitive Layer

The following coating solution was coated over the above-prepared polymerizable layer, and the coated layer of the solution was dried to give a light-sensitive layer having a dry thickness of about 6.0 μm. Thus, a light-sensitive material (301) was prepared.

| (Coating solution) | |
|---|---|
| 10 Weight % aqueous solution of PVA-117 (polyvinyl alcohol, tradename of Kuraray Co., Ltd., saponification degree: 98.5%) | 70.0 g |
| 10 Weight % aqueous solution of PVA-205 (polyvinyl alcohol, tradename of Kuraray Co., Ltd., saponification degree: 88%) | 30.0 g |
| The above-prepared base precursor dispersion | 6.2 g |
| Ethylene urea | 2.0 g |
| 0.13 Weight % propylene glycol solution of the following development accelerator | 2.7 g |
| The above-prepared silver halide emulsion | 1.8 g |
| 5 Weight % aqueous solution of the surface active agent (WW-1) | 9.0 g |
| Water | 13.0 g |

Development accelerator

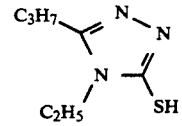

A light-sensitive material 304 was prepared in the same manner as in preparation of the light-sensitive material 301 except that the polymerizable compound (MN-4) was used in place of the polymerizable compound (MN-1). The amount of the polymerizable compound (MN-4) was the same as the amount of the polymerizable compound (MN-1).

Image Formation and Evaluation Thereof

Each of the light-sensitive materials (301) and (304) was brought into close contact with an original image film, and the material was exposed to light of a tungsten lamp of 500 W at 50 lux for 1 second. Then, the surface of the light-sensitive layer was brought into close contact with a hot plate heated to 135° C. to thermally develop the light-sensitive material for 25 seconds. Thus, a silver image was found on the exposed portion. The light-sensitive material was then immersed in Fuji PS developing solution DN-3C (available from Fuji Photo Film Co., Ltd.) at room temperature for 1 minute and then sufficiently washed out with water, to remove all the light-sensitive layer and the unexposed portion of the polymerizable layer.

Thus, a relief polymer image of red color was formed from the light-sensitive material 301 on the exposed portion. The obtained printing plate was mounted on a Heidelberg KOR-D type printing machine and a printing operation was performed. As a result, a clear print was obtained.

On the other hand, the relief polymer image formed from the light-sensitive material 302 was thin and vague because the polymerization of the polymerizable layer was insufficient.

EXAMPLE 4 Preparation of High Boiling Point Organic Compound Dispersion (HB-1)

To 50 g of 10% aqueous solution of carboxyl modified polyvinyl alcohol (tradename: PVA KL 318, available from Kuraray Co., Ltd.) kept at 60° C. were added 15 g of 5% aqueous solution of sodium dodecylbenzenesulfonate and 50 g of the polymerizable compound (MN-1). The mixture was stirred at 8,000 r.p.m. for 10 minutes using a homogenizer (produced by Nippon Seiki Co., Ltd.).

Preparation of Acidic Compound Dispersion (AB-1)

Into a 300 ml dispersion container were added 20 g of stearic acid (melting point: 69°–70° C.), 93 g of 10% aqueous solution of carboxyl modified polyvinyl alcohol (tradename: PVA KL 318, available from Kuraray Co., Ltd.), 39 g of 5% aqueous solution of the surface active agent (WW-1), 48 g of 1% aqueous solution of the surface active agent (WW-2) and 200 ml of glass beads (diameter: 0.5–0.75 mm). The resulting mixture was stirred at 3,000 r.p.m. for 30 minutes using a Dyno-mill to obtain an acidic compound dispersion (AB-1). The grain size of the stearic acid was not more than 1.0 μm.

Preparation of Light-Sensitive Material 401

To a mixture of 15 g of the light-sensitive microcapsule dispersion (CB-1), 15 g of the light-sensitive microcapsule dispersion (CG-1) and 15 g of the light-sensitive microcapsule dispersion (CR-1) were added 6.5 g of 5% aqueous solution of the surface active agent (WW-1), 8 g of 1% aqueous solution of the surface active agent (WW-2), 9 g of 10% aqueous solution of carboxyl modified polyvinyl alcohol (tradename: PVA KL 318, available from Kuraray Co., Ltd.), 15 g of the high boiling point organic compound dispersion (HB-1), 14 g of the acidic compound dispersion (AB-1) and 1 g of water. The resulting mixture was stirred at 40° C. for 10 minutes. The mixture was filtered from a mesh of 44 μm to prepare a coating solution.

With 109 ml/m² of the prepared coating solution, a thin aluminum layer deposited on a polyethylene terephthalate film (thickness: 25 μm) was coated according to an extrusion method. Then the coated layer of the solution was dried at 60° C. The dried coated film was rolled up under the conditions of 25° C. and 65% so that the coated surface might be inside. Thus, a light-sensitive material 401 was prepared.

Preparation of Light-Sensitive Material 402

A light-sensitive material 402 was prepared in the same manner as in the preparation of the light-sensitive material 401 except that 13 g of 6-hydroxy-2-naphthoic acid and 7 g of water were used in place of the stearic acid.

Preparation of Light-Sensitive Material 403

A light-sensitive material 403 was prepared in the same manner as in the preparation of the light-sensitive material 401 except that 22 g of 4-hydroxybiphenyl-3-carboxylic acid and 9 g of 2-naphthoic acid were used in place of the stearic acid.

Preparation of Microcapsules Containing Acidic Compound

In 20 g of the polymerizable compound (MN-1) were dissolved 10 g of stearic acid and 10 g of Takenate D110N (tradename, produced by Takeda Chemical Industries, Ltd.) to prepare an oily solution. To 50 g of 10% aqueous solution of carboxyl modified polyvinyl alcohol (tradename: PVA KL 318, available from Kuraray Co., Ltd.) kept at 60° C. was added the oily solution. The mixture was stirred at 5,000 r.p.m. for 5 minutes at 60° C. using a dissolver of 40 φ to obtain an O/W emulsion. The emulsion was further stirred at 1,500 r.p.m. using a propeller mixer at 70° C. for 90 minutes to prepare a microcapsule dispersion. The mean particle size of the microcapsules containing the acidic compound is not more than 5 μm.

Preparation of Light-Sensitive Material 404

A light-sensitive material 404 was prepared in the same manner as in the preparation of the light-sensitive material 401 except that 15 g of the above-prepared microcapsule dispersion was used in place of 14 g of the acidic compound dispersion (AB-1) and 1 g of water.

Preparation of Light-Sensitive Material 405

A light-sensitive material 405 was prepared in the same manner as in the preparation of the light-sensitive material 401 except that 15 g of water was used in place of 14 g of the acidic compound dispersion (AB-1) and 1 g of water.

Image Formation and Evaluation Thereof

Each of the light-sensitive materials 401 to 405 was exposed to light at 5,000 lux for 1 second at color temperature of 3,100° K. using a halogen lamp through a wedge containing a black silver image in which the transmission density is changed from 0 to 4.0 and a cyan filter (sp-5, produced by Fuji Photo Film Co., Ltd.). Then, an image was formed on an image-receiving material in the same manner as in Example 1. As a result, a clear image was formed on the image-receiving material. The maximum density of the image was more than 1.4, and the minimum density was less than 0.10. Further, the yellow density of the image was measured within the area of the cyan density was 1.2. The results are set forth in Table 2.

TABLE 2

| Light-sensitive Material | Acidic Compound | Yellow Density |
|---|---|---|
| 401 | Stearic acid | 0.21 |
| 402 | 6-Hydroxy-2-naphthoic acid | 0.22 |
| 403 | 4-Hydroxybiphenyl-3-carboxylic acid | 0.22 |

TABLE 2-continued

| Light-sensitive Material | Acidic Compound | Yellow Density |
|---|---|---|
| | and 2-naphthoic acid | |
| 404 | Stearic acid | 0.20 |
| 405 | None | 0.34 |

As is evident from the results of Table 2, the light-sensitive material 401 to 404 form a clear cyan color image wherein the yellow stain is reduced.

We claim:

1. A light-sensitive material which comprises a support and a light-sensitive layer provided thereon, said light-sensitive layer containing silver halide, a reducing agent and a polymerizable compound,
   wherein the polymerizable compound is a (meth)acrylic ester of an adduct of ditrimethylolpropane with an alkylene oxide, the amount of said alkylene oxide in the adduct being 1 to 10 mole based on one mole of ditrimethylolpropane.

2. The light-sensitive material as claimed in claim 1, wherein the polymerizable compound is represented by the formula [I]:

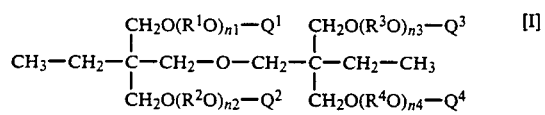

wherein each of $R^1$, $R^2$, $R^3$ and $R^4$ independently is an alkylene group having two or more carbon atoms; each of n1, n2, n3 and n4 independently is an integer of 0 to 10; the sum of n1, n2, n3 and n4 is 1 to 10; each of $Q^1$, $Q^2$, $Q^3$ and $Q^4$ independently is hydrogen, acryloyl or methacryloyl; and at least one of $Q^1$, $Q^2$, $Q^3$ and $Q^4$ is acryloyl or methacryloyl.

3. The light-sensitive material as claimed in claim 2, wherein each of $R^1$, $R^2$, $R^3$ and $R^4$ independently is an alkylene group represented by the following formula:

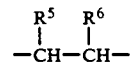

wherein each of $R^5$ and $R^6$ independently is hydrogen or an alkyl group.

4. The light-sensitive material as claimed in claim 2, wherein the sum of n1, n2, n3 and n4 is 1 to 5.

5. The light-sensitive material as claimed in claim 2, wherein each of $Q^1$, $Q^2$, $Q^3$ and $Q^4$ independently is acryloyl or methacryloyl.

6. The light-sensitive material as claimed in claim 1, wherein the polymerizable compound is contained in the light-sensitive layer in an amount of 0.01 to 20 g/m².

7. The light-sensitive material as claimed in claim 1, wherein the amount of the polymerizable compound is in the range of 0.1 to 1,000 weight parts based on 1 weight part of the reducing agent.

8. The light sensitive material as claimed in claim 1, wherein the silver halide, the reducing agent and the polymerizable compound are contained in microcapsules which are dispersed in the light-sensitive layer.

9. The light-sensitive material as claimed in claim 8, wherein the microcapsules further contain a color image forming substance.

10. The light-sensitive material as claimed in claim 8, wherein the microcapsules further contain a base precursor.

* * * * *